(12) United States Patent
Girdhar et al.

(10) Patent No.: US 7,750,426 B2
(45) Date of Patent: Jul. 6, 2010

(54) JUNCTION BARRIER SCHOTTKY DIODE WITH DUAL SILICIDES

(75) Inventors: Dev Alok Girdhar, Melbourne, FL (US); Michael David Church, Sebastian, FL (US); Alexander Kalnitsky, San Francisco, CA (US)

(73) Assignee: Intersil Americas, Inc., Milipitas, CA (US)

( * ) Notice: Subject to any disclaimer, the term of this patent is extended or adjusted under 35 U.S.C. 154(b) by 451 days.

(21) Appl. No.: 11/849,565

(22) Filed: Sep. 4, 2007

(65) Prior Publication Data

US 2008/0296721 A1    Dec. 4, 2008

Related U.S. Application Data

(60) Provisional application No. 60/940,750, filed on May 30, 2007.

(51) Int. Cl.
  *H01L 27/095* (2006.01)
  *H01L 29/47* (2006.01)
  *H01L 31/07* (2006.01)

(52) U.S. Cl. .................. 257/476; 257/471; 257/485; 257/E29.338

(58) Field of Classification Search .............. 257/476, 257/475, 471, 484, 485, E29.338
See application file for complete search history.

(56) References Cited

U.S. PATENT DOCUMENTS

| 4,816,879 | A | * | 3/1989 | Ellwanger | 257/486 |
|---|---|---|---|---|---|
| 4,835,580 | A | * | 5/1989 | Havemann et al. | 257/478 |
| 5,371,400 | A | * | 12/1994 | Sakurai | 257/478 |
| 6,861,723 | B2 | | 3/2005 | Willmeroth | |
| 6,936,850 | B2 | * | 8/2005 | Friedrichs et al. | 257/77 |
| 7,615,839 | B2 | * | 11/2009 | Souma et al. | 257/473 |
| 2004/0046224 | A1 | | 3/2004 | Rossel et al. | |
| 2006/0131686 | A1 | | 6/2006 | Wu | |
| 2006/0237813 | A1 | | 10/2006 | Hshieh et al. | |
| 2006/0244050 | A1 | | 11/2006 | Sudou | |

FOREIGN PATENT DOCUMENTS

| JP | 53-053270 | 5/1978 |
|---|---|---|
| JP | 2003-188391 | 7/2003 |

\* cited by examiner

*Primary Examiner*—Shouxiang Hu

(57) ABSTRACT

An integrated circuit, including a junction barrier Schottky diode, has an N type well, a P-type anode region in the surface of the well, and an N-type Schottky region in the surface of the well and horizontally abutting the anode region. A first silicide layer is on and makes a Schottky contact to the Schottky region and is on an adjoining anode region. A second silicide layer of a different material than the first silicide is on the anode region. An ohmic contact is made to the second silicide on the anode region and to the well.

6 Claims, 6 Drawing Sheets

JUNCTION BARRIER SCHOTTKY DIODE WITH DUAL SILICIDES

BACKGROUND AND SUMMARY OF THE DISCLOSURE

The present disclosure relates generally to integrated circuits and, more specifically, to a junction barrier Schottky diodes (JBS) in the integrated circuit.

Integrated circuits have generally included Schottky diodes for power applications. Schottky diodes tend to be very leaky at high reverse bias and high temperatures. Circuit designers have used junction barrier Schottky diodes to provide a solution to the leaky Schottky diodes. This combination provides a Schottky-like forward conduction and PN diode like reverse blocking of voltage. It basically includes a PN junction and a Schottky junction diode in parallel. The formation of Schottky diodes in integrated circuits generally uses the metal which forms a silicide with a silicon substrate that is used throughout the integrated circuit. For example, the integrated circuit that requires a low leakage, low forward bias drop Schottky diode, is typically manufactured in a process which uses Titanium as the silicidation metal. The resulting $TiSi_2$ is known to have a low barrier height which yields low forward bias drop, but has higher reverse leakage than other silicides. In some applications it may be desirable to have a lower reverse leakage current at the expense of higher forward bias voltage drop. To use different silicides in the same fabrication process has historically been avoided because of the cross contamination. The present disclosure provides a method for implementing a dual silicide process without cross contamination.

An integrated circuit of the present disclosure includes junction barrier Schottky diode which has an N-type silicon well having surface; a P-type anode region in the surface of the well; and a portion of the surface of the well horizontally abutting the anode region being an N-type Schottky region. A first silicide layer is on the Schottky region and an adjoining portion of the anode region. The first silicide layer forms a Schottky barrier with the Schottky region. A second silicide layer of a different material than the first silicide layer is on the anode region. An ohmic contact is to the second silicide layer on the anode region, and an ohmic contact is to the well.

The first and second silicide layers are spaced from each other on the anode region. The well may include an N-type cathode contact region in the surface having a higher impurity concentration than the Schottky region's impurity concentration, and the ohmic contact to the well is to the cathode contact region or to portions of the second silicide layer on the cathode contact region. The well may include an N-type buried layer having a higher impurity concentration than the well's impurity concentration and the N-type cathode contact region extends from the surface to buried layer.

A method of manufacturing an integrated circuit having the junction barrier Schottky diode of the disclosure includes forming a P-type anode region in a surface of an N-type well; forming a first mask with an opening exposing an N-type Schottky region of the surface of the well and adjoining portion of the anode region; and applying a first material which forms a first silicide layer of the first material with the exposed portions of the Schottky and anode regions. A second mask is formed with an opening exposing a portion of the anode region not having the first silicide layer; and a second material, different from the first material, is applied and forms a second silicide layer of the second material with the exposed portion of the anode region. An ohmic contact is made to the second silicide layer on the anode region, and an ohmic contact is made to the well.

The first and second silicide layers are formed spaced from each other on the anode region. The method may include forming an N-type cathode contact region in the surface having a higher impurity concentration than the Schottky region's impurity concentration. The second silicide layer may be formed on the cathode contact region. The ohmic contact to the well may be directly to the cathode contact region or to the second silicide layer on the cathode contact region. The well may include an N-type buried layer having a higher impurity concentration than the well's impurity concentration; and the methods includes forming the N-type cathode contact region extending from the surface to buried layer, and forming the ohmic contact to the well to the cathode contact region.

These and other aspects of the present disclosure will become apparent from the following detailed description of the disclosure, when considered in conjunction with accompanying drawings.

DETAILED DESCRIPTION OF THE PREFERRED EMBODIMENTS

Figure 1:
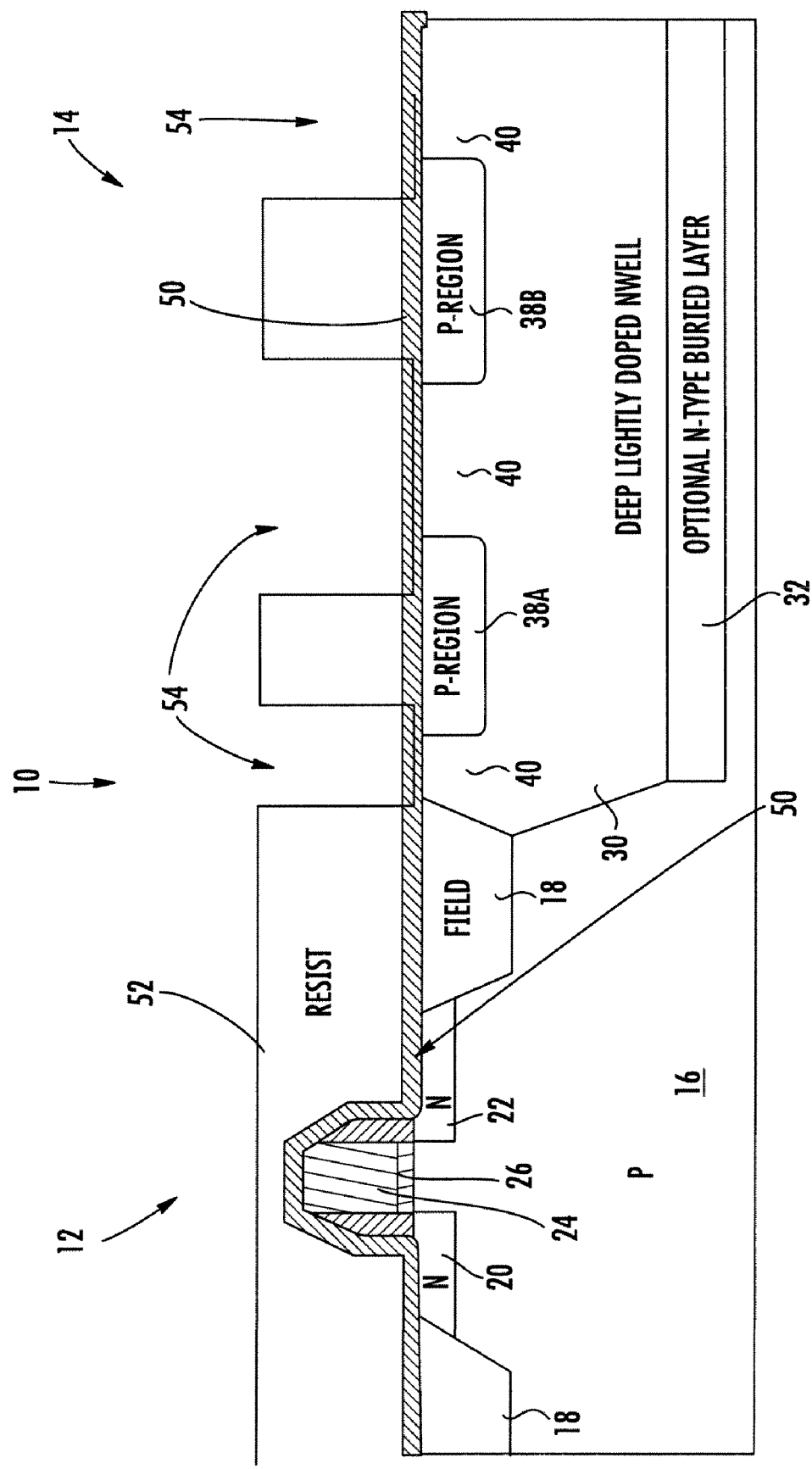
FIG. 1 is cross-sectional view of an integrated circuit including a junction barrier Schottky diode at a first mask stage of according to a method of the present disclosure.

FIG. 1 illustrates an integrated circuit 10 including a field effect transistor FET 12 and a junction barrier Schottky (JBS) diode 14. A P-type silicon substrate 16 includes lateral oxide or field isolation regions 18 offering lateral isolation at the surface between various devices including the FET 12 and the JBS 14. The FET 12 is illustrated as including an N-type source 20 and drain 22 in the P-type substrate 16. A gate 24 is separated from the channel region between the source 20 and the drain 22 by a gate oxide 26.

The junction barrier Schottky diode 14 includes an N-type well 30 having an optional buried N+ layer 32. A pair of P-type anode regions 38A and 38B are formed in the surface of region of well 30. A Schottky region 40 of the well laterally abuts the pair of anode regions 38. Region 38A may also abut Field 18 and the intervening region 40 will not be present.

After the formation of the source and drain regions 20 and 22, the gate structure 24,26 and the anode regions 38A and 38B, the silicide process is begun. The integrated circuit is covered by a silicide blocking material 50, for example a silicide blocking oxide. This may be in the range of 200 angstroms thick. A photo resist material 52 is applied and patterned to form openings 54 exposing the Schottky regions 40 and a portion of the anode regions 38A and 38B. The portions of layer 50 exposed by the opening of 54 are removed by, for example, etching. Photo resist 52 is removed and the wafer is cleaned.

Figure 2:
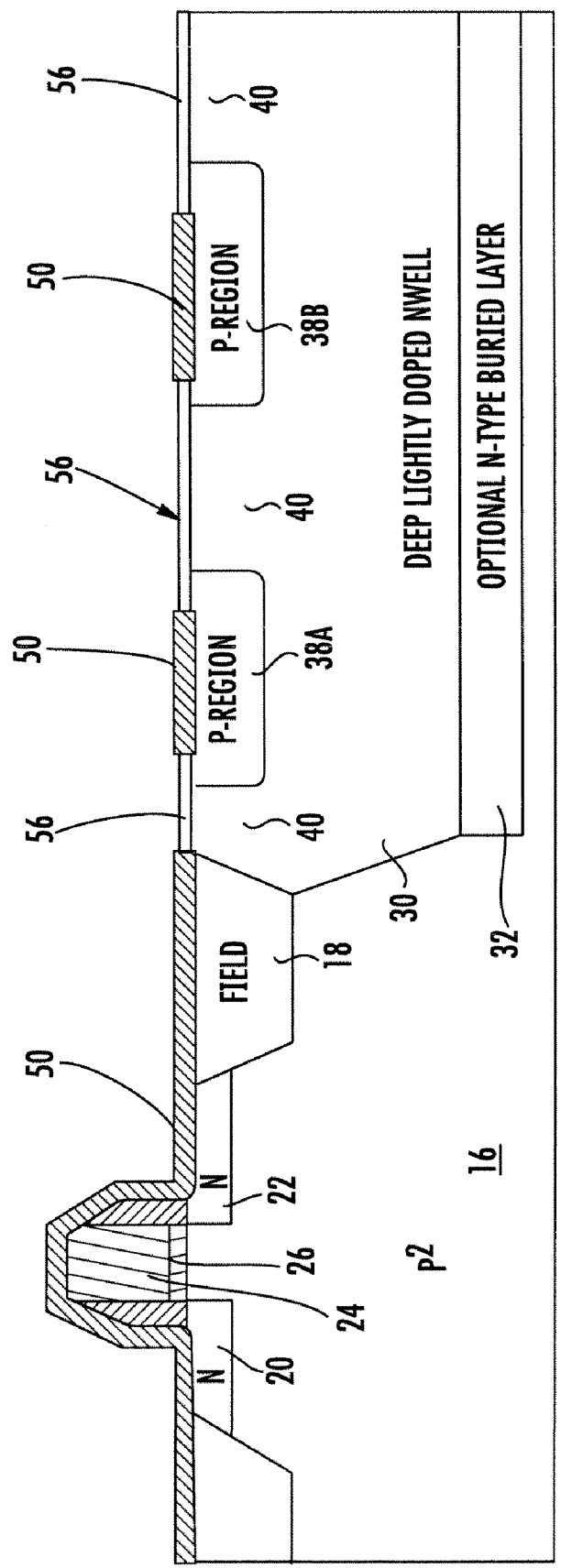
FIG. 2 is cross-sectional view of the integrated circuit after the first silicide stage of a method of the present disclosure

The first silicide material is applied to the integrated circuit and on the exposed surface regions of the well 30 and treated to form a first silicide 56 with the exposed silicon of the substrate. The applied first material which is not converted to a silicide is then removed. The resulting structure is illustrated in FIG. 2. The first silicide 56 is on the Schottky region 40 as well as extending on to adjacent portions of the anode region 38A and 38B. The remainder of the silicide blocking layer 50 is shown as remaining on the substrate. In the present example, Cobalt may be the first material applied which will form silicide with the Schottky region 40.

Figure 3:
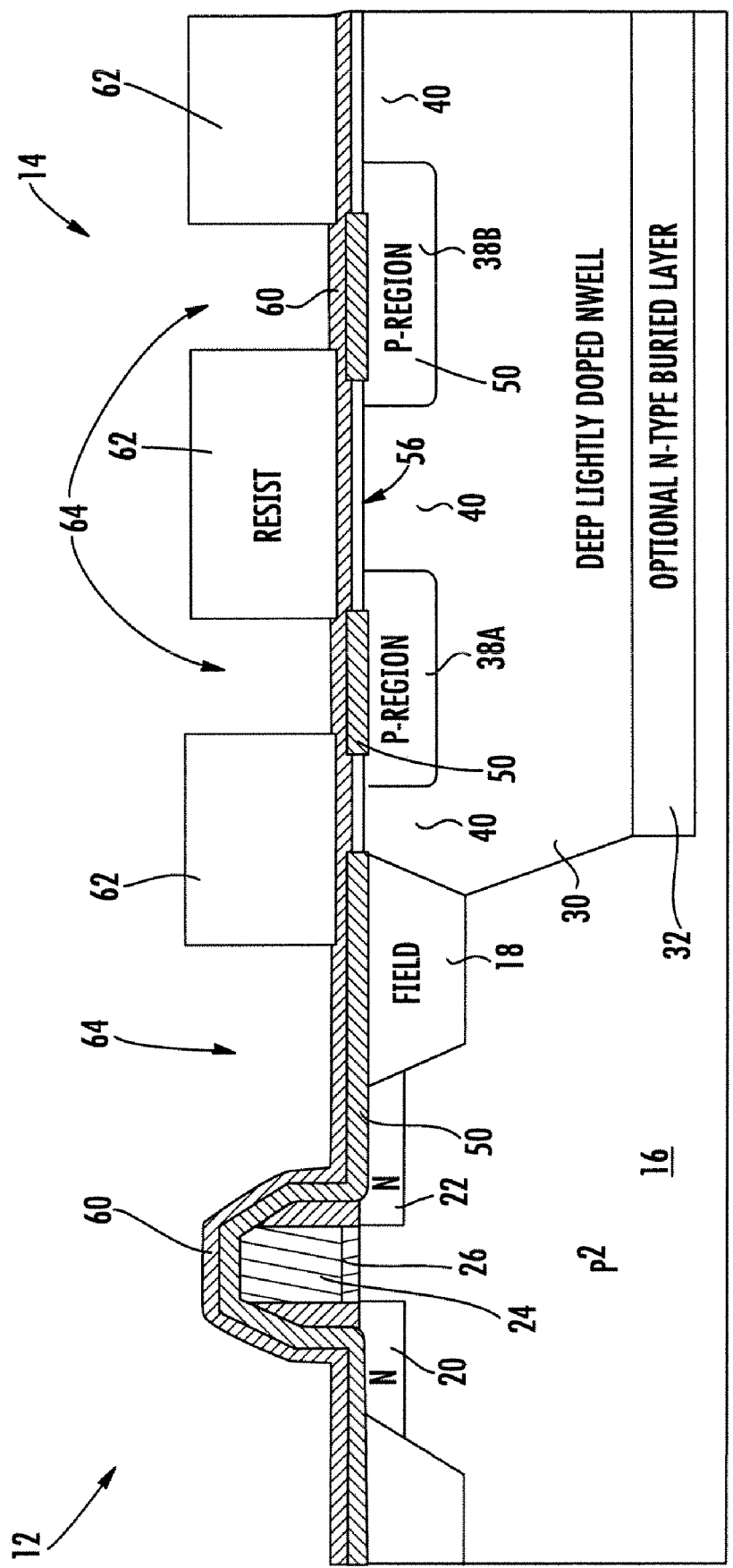
FIG. 3 is cross-sectional view of the integrated circuit at a second mask stage of a method of the present disclosure
Figure 4:
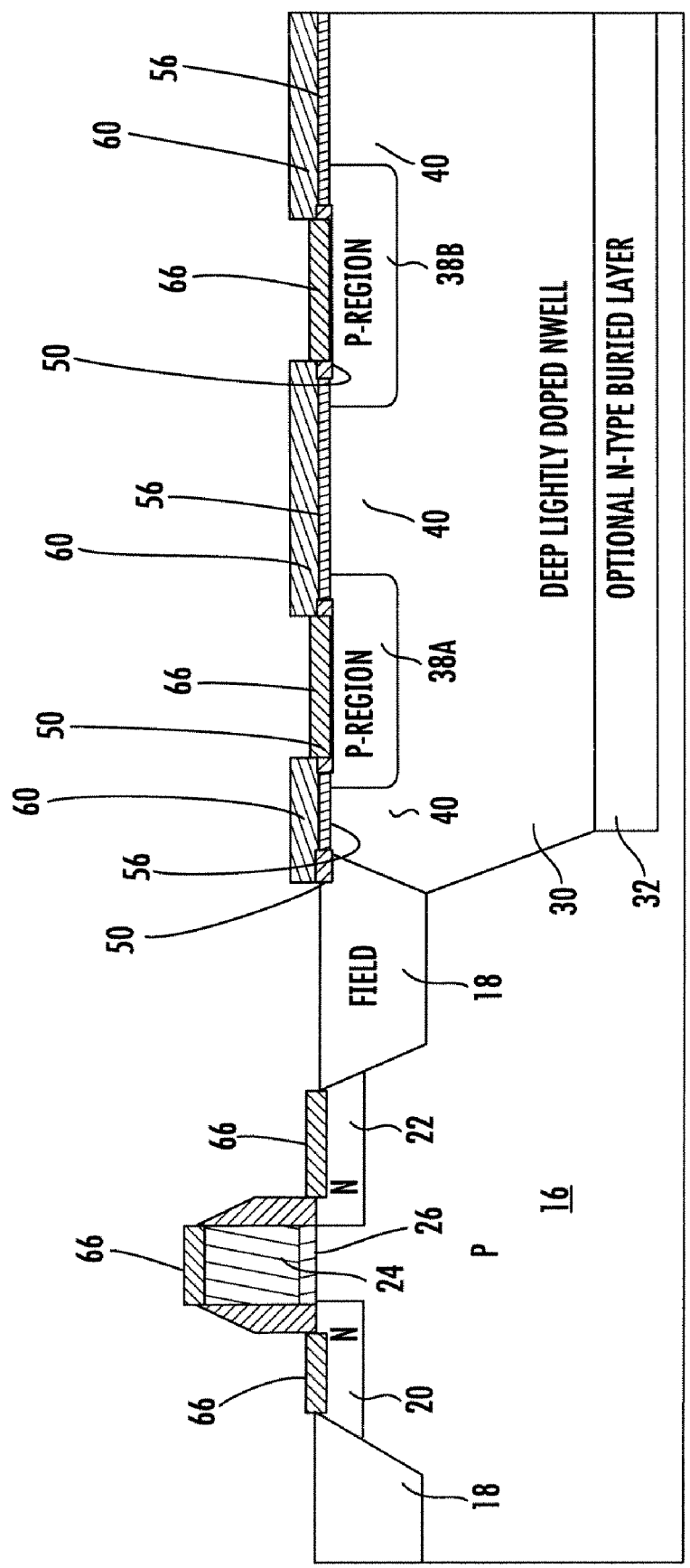
FIG. 4 is cross-sectional view of the integrated circuit after the second silicide stage of a method of the present disclosure

A second silicide blocking layer 60 is applied as illustrated in FIG. 3. Again, this may be an oxide in the range of 200 to 300 angstroms. A photo resist layer 62 is applied and openings 64 are formed. In addition to the exposed areas of the FET transistor 12, portions of the anode regions 38A and 38B are exposed. Only the portion of the region not covered by the first silicide layer 56 is exposed. This is important because the two resulting silicide layers should be physically isolated. The exposed portions of silicide blocking masks 50 and 60 are removed by, for example etching, to expose surfaces of the surface area of the substrate to which the second silicide layers are to be applied. The photo resistance material 62 is removed and the wafer is cleaned. A second metal 66, different from the first metal 56, which forms silicide is then applied and treated to form a silicide with the exposed areas. This forms silicide layer 66 as illustrated in FIG. 4. The unreacted second metal is then removed. The second silicide 66 is separated from the first silicide 56 by the silicide barrier mask 50 on the anode regions 38A and 38B.

In the present example, the second metal is Titanium which is typically used in integrated circuits. Titanium silicide is known to have a low barrier height which yields low forward bias drop and higher reverse leakage current then other silicide metals. The use of Cobalt silicide produces a Schottky diode with higher forward bias drop but lower reverse leakage current on the same chip. Although the example shown has the first silicide on the Schottky region 40 and the second silicide on the FET 12 and the anodes 38, the second silicide may be provided on the Schottky region 40 of another Schottky structure on the same integrated circuit. This will produce two different Schottky diodes on the same integrated circuits having different forward bias drops and reverse leakage currents.

The example applied Cobalt first because it has higher tolerances to elevated temperatures compared to Titanium. Thus, it is on the integrated circuit longer and subject to more heating cycles. Another example, where Titanium and Platinum are used as the two silicide metals, the Titanium would be applied first and the Platinum would be applied second. Other known metals which will form suicides may be used. Cobalt and Titanium are just two examples.

Figure 5:
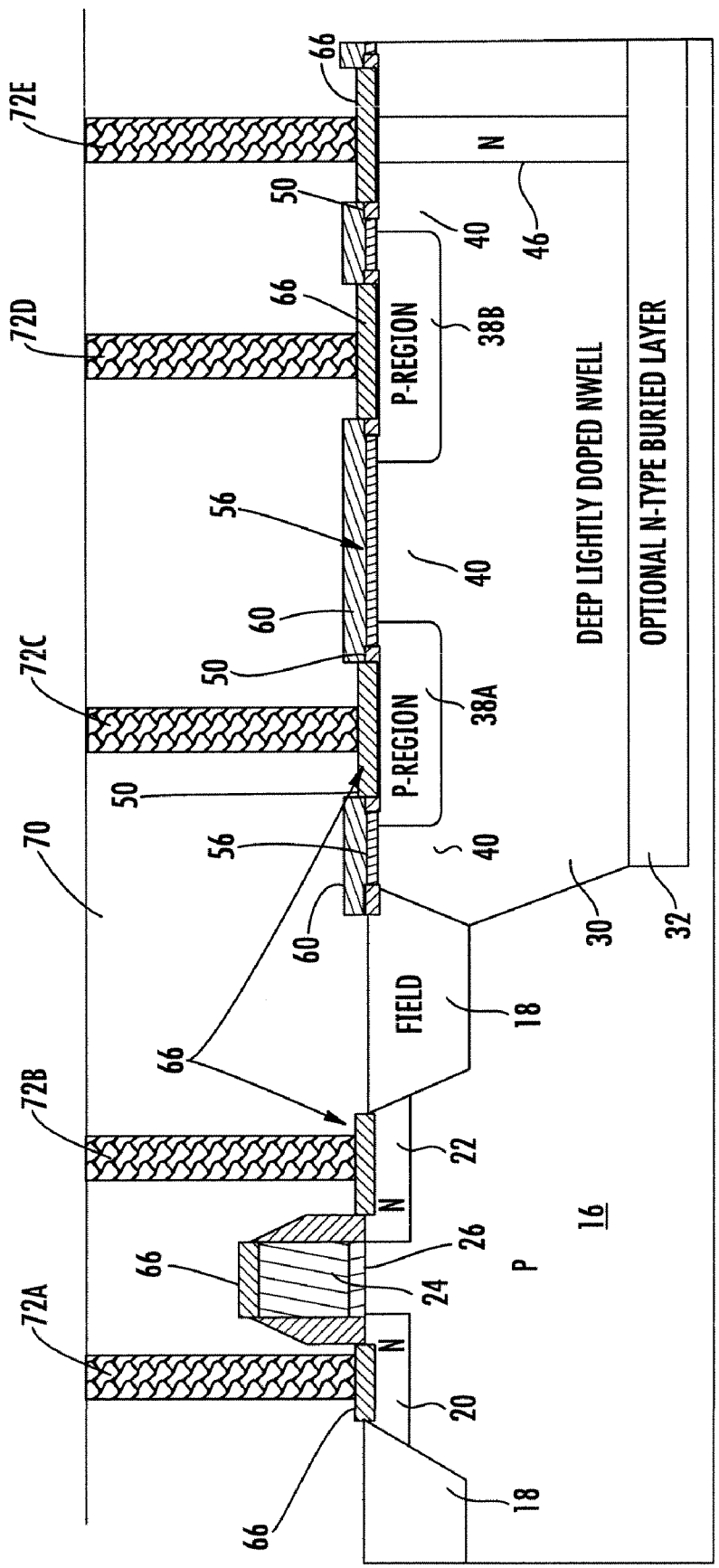
FIG. 5 is cross-sectional view of the integrated circuit after the interconnect stage of a method of the present disclosure

The process is then concluded with forming the remaining insulted layers and metal contacts. As illustrated in FIG. 5, the surface insulted layer 70, for example oxide and patterned with openings for contacts 72 to the operative portions of the integrated circuit. Contacts 72A and 72B are connected to source 20 and drain region 22 respectfully. Contacts 72C and 72D are made to the anode region 38A and 38B. An N-type cathode contact region 46, having an higher impurity concentration than the well 30, extends from the surface of the substrate down to the buried layer 32. Not shown in the previous process, the second silicide layer 66 is formed on the surface of the cathode contact region 46. It is separated from the first silicide region 56 by the silicide blocking material 50. Contact 72E is made to the cathode contact region 46 and the buried region 32. The parallel connection of the anode region 38A of the PN junction diode and the anode region or the Schottky metal 56 of the Schottky diode is through the anode regions 38A and 38B. There is no metal contact 72 directly to the first silicide 56.

It should be noted that the Schottky region 40 at the surface of the well 30 has an impurity concentration so as to form a Schottky diode with the first silicide material 56. Depending upon the material, the impurity concentration of the Schottky region 40 may vary. They may be of a lower impurity concentration than the impurity concentration of the well 30. Other modifications of the impurity concentration profile of the well structure 30 may be performed to increase the reverse blocking voltage of the junction barrier Schottky diode.

Figure 6:
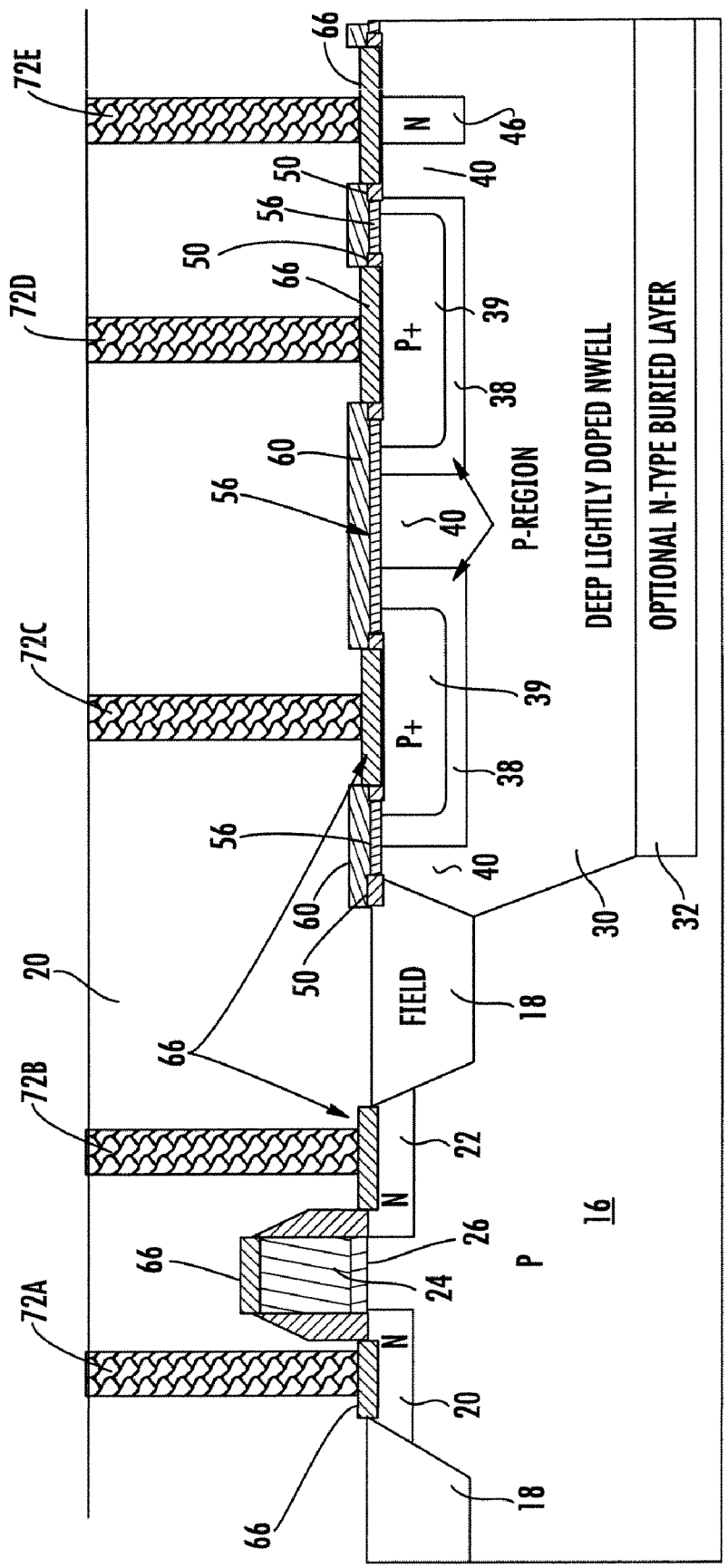
FIG. 6 is cross-sectional view of another integrated circuit after the interconnect stage of a method of the present disclosure.

As illustrated in FIG. 6, the cathode contact region 46 may not extend all the way down to the N buried layer 32, which may be eliminated or not included in the well 30. Also in certain situations, the P anode regions 38 may include P+ implant. This would prevent face-to-face or back-to-back Schottky diodes. A second implant 39 is illustrated in FIG. 6. Although the anode region 38A and 38B are shown as two separate regions with abutting Schottky regions 40, the anode 38 may be a single ring. Also, the Schottky regions 40 may be a ring with a single anode region 38 in its interior. Although the present structure has been described with respect to a junction barrier Schottky diode, the dual silicide method may also be used with a single Schottky diode without the PN diode.

Although the present disclosure had been described and illustrated in detail, it is to be clearly understood that this is done by way of illustration and example only and is not to be taken by way of limitation. The scope of the present disclosure is to be limited only by the terms of the appended claims.

What is claimed:

1. An integrated circuit including a junction barrier Schottky diode, the diode comprising:
   an N-type silicon well having surface;
   a P-type anode region in the surface of the well;
   a portion of the surface of the well horizontally abutting the anode region being an n-type Schottky region;
   a first silicide layer on the Schottky region and an adjoining portion of the anode region, the first silicide layer forming a Schottky barrier with the Schottky region;
   a second silicide layer of a different material than the first silicide layer on the anode region; and
   an ohmic contact to the second silicide layer on the anode region, and an ohmic contact to the well,
   wherein the first and second silicide layers are spaced from each other on the surface.

2. The integrated circuit of claim 1, wherein the well includes an N-type cathode contact region in the surface having a higher impurity concentration than the Schottky region's impurity concentration, and the ohmic contact to the well is to the cathode contact region.

3. The integrated circuit of claim 2, wherein the well includes an N-type buried layer having a higher impurity concentration than the well's impurity concentration and the n-type cathode contact region extends from the surface to buried layer.

4. The integrated circuit of claim 2, wherein a portion of the second silicide layer is on a portion of the cathode contact region and the ohmic contact to the well is to the portion of the second silicide layer on the cathode contact region.

5. The integrated circuit according to claim 1, wherein the first silicide layer is Cobalt silicide and the second silicide layer is a Titanium silicide.

6. The integrated circuit according to claim 1, wherein the first silicide layer is Titanium silicide and the second silicide layer is a Platinum silicide.

* * * * *